US012559677B2

(12) United States Patent
Kimura et al.

(10) Patent No.: US 12,559,677 B2
(45) Date of Patent: Feb. 24, 2026

(54) CERAMIC PHOSPHOR PLATE

(71) Applicant: CoorsTek KK, Tokyo (JP)

(72) Inventors: Kosuke Kimura, Kanagawa (JP);
Masaki Irie, Kanagawa (JP)

(73) Assignee: CoorsTek GK, Tokyo (JP)

( * ) Notice: Subject to any disclaimer, the term of this
patent is extended or adjusted under 35
U.S.C. 154(b) by 447 days.

(21) Appl. No.: 17/992,658

(22) Filed: Nov. 22, 2022

(65) Prior Publication Data

US 2023/0203371 A1 Jun. 29, 2023

(30) Foreign Application Priority Data

Dec. 28, 2021 (JP) ................................. 2021-213732
Jun. 30, 2022 (JP) ................................. 2022-106091

(51) Int. Cl.
*C09K 11/08* (2006.01)
*C09K 11/02* (2006.01)
*H10H 20/851* (2025.01)

(52) U.S. Cl.
CPC .............. *C09K 11/08* (2013.01); *C09K 11/02*
(2013.01); *H10H 20/851* (2025.01)

(58) Field of Classification Search
CPC ....... C09K 11/08; C09K 11/02; C09K 11/025;

H10K 50/86; H10K 59/8791; H10H
20/841; H10H 20/851; H10H 20/84;
H10H 20/8514; H10H 29/8421; H01L
33/502
See application file for complete search history.

(56) References Cited

U.S. PATENT DOCUMENTS

2020/0303597 A1* 9/2020 Takaku .................. F21V 29/502

FOREIGN PATENT DOCUMENTS

JP 2019066632 A * 4/2019 ........... C04B 35/117

* cited by examiner

*Primary Examiner* — Matthew E. Hoban
*Assistant Examiner* — Lynne Edmondson
(74) *Attorney, Agent, or Firm* — PROCOPIO, CORY,
HARGREAVES & SAVITCH LLP

(57) ABSTRACT

The present invention relates to a ceramic phosphor plate
including: a ceramic substrate having a light incident surface
and a light emitting surface facing the light incident surface;
and an antireflection film formed at least on the light
emitting surface, in which the light emitting surface of the
ceramic substrate has an uneven shape including a concave
portion and a convex portion, the light emitting surface has
an arithmetic mean roughness (Ra) of 0.1 μm or more and
0.7 μm or less, and a Kurtosis (Rku) obtained from a surface
roughness curve of 5 or more and 10 or less.

2 Claims, 2 Drawing Sheets

ANTIREFLECTION FILM

CENTER LINE

CERAMIC SUBSTRATE

ANTIREFLECTION FILM

CERAMIC SUBSTRATE

FIG. 3

LINE = Rough     : 32.788   [um]

[um]   Length = 163.939 um     163.939 (85.343,11.836)

FIG. 4

LINE = Rough     : 32.788   [um]

[um]   Length = 163.939 um     10.536 (5.653,108.685)

CERAMIC PHOSPHOR PLATE

TECHNICAL FIELD

The present invention relates to a ceramic phosphor plate with which white light is obtained by wavelength conversion of light emitted from a light emitting diode (LED) or a laser diode (LD).

BACKGROUND ART

LEDs are applied to mobile phones, various display devices, and the like from the viewpoints of power saving, long life, small size, and the like. Further, with the improvement of light emission efficiency in recent years, it has been attracting attention in lighting applications, which is rapidly becoming widespread.

Currently, a mainstream method of obtaining white light in white LED lighting is to mix light emitted by a blue LED and light emitted from a phosphor that emits yellow light, which is a complementary color of blue, in response to incident light of the blue light. In the related art, a wavelength conversion member in which such a phosphor is used is generally one in which a phosphor powder is dispersed in a resin. However, in recent years, from the viewpoint of heat resistance, a complex with a ceramic has been widely used.

Patent Literature 1 discloses an invention relating to a light wavelength conversion member, i.e., a light wavelength conversion device having a structure including a light wavelength conversion member, a heat dissipation member having heat dissipation property better than that of the light wavelength conversion member, a joint portion for joining the light wavelength conversion member and the heat dissipation member, an antireflection film on a first surface on which light of the light wavelength conversion member is incident, a reflection film on a second surface opposite to the first surface, and an intermediate film between the reflection film and the joint portion, in which light reflected by the reflection film is emitted from the first surface. The light wavelength conversion member in Patent Literature 1 includes a ceramic sintered body including a phosphorescent phase mainly composed of phosphorescent crystal particles and a translucent phase mainly composed of translucent crystal particles, and the ceramic sintered body has a garnet structure represented by $A_3B_5O_{12}$:Ce (A is Sc, Y, and lanthanoid (excluding Ce), B is Al, and both A and B may further include Gd).

The surface roughness (arithmetic mean roughness Ra) of the first surface of the light wavelength conversion member is preferably 0.001 μm<Ra<0.4 μm, and an antireflection film is formed on such a first surface.

Here, in the ceramic sintered body, when the surface roughness is large, diffuse reflection on the first surface occurs, making it difficult to efficiently extract the emitted light; but on the other hand, when the surface roughness is small, specular reflection on the first surface occurs, making it difficult to efficiently extract the incident light. In the light wavelength conversion member disclosed in Patent Literature 1, an antireflection film is formed on a surface as fired, and as shown in FIG. 2A of the present specification, since the surface has an uneven shape that is uneven up and down with a center line as a boundary, when the first surface is the emission surface, light is reflected inside the convex portion, light extraction efficiency is low, and color unevenness easily occurs.

In LED lighting where uniform emission color is required, improvement such as adjusting the surface roughness of the ceramic sintered body has been necessary for the wavelength conversion member made of the ceramic sintered body in order to prevent occurrence of color unevenness due to the surface roughness and to improve the light extraction efficiency.

CITATION LIST

Patent Literature

Patent Literature 1: JP-A-2019-66632

SUMMARY OF INVENTION

Technical Problem

An object of the present invention is to provide a ceramic phosphor plate which prevents occurrence of color unevenness and has improved light extraction efficiency.

Solution to Problem

A ceramic phosphor plate according to the present invention includes:

- a ceramic substrate having a light incident surface and a light emitting surface facing the light incident surface; and
- an antireflection film formed at least on the light emitting surface,
- in which the light emitting surface of the ceramic substrate has an uneven shape including a concave portion and a convex portion,
- the light emitting surface has an arithmetic mean roughness (Ra) of 0.1 μm or more and 0.7 μm or less, and a Kurtosis (Rku) obtained from a surface roughness curve of 5 or more and 10 or less.

It is preferable that an upper surface of the convex portion of the light emitting surface is a surface obtained by grinding or polishing a fired surface of the ceramic substrate substantially parallel to the light incident surface, and the concave portion of the light emitting surface is the fired surface of the ceramic substrate.

It is preferable that the antireflection film includes two or more kinds of materials having different refractive indexes, and has a total thickness of 500 nm or more and 700 nm or less.

Advantageous Effects of Invention

According to the present invention, it is possible to provide a ceramic phosphor plate which prevents occurrence of color unevenness and has improved light extraction efficiency.

BRIEF DESCRIPTION OF DRAWINGS

FIG. 3 is a graph showing a roughness curve of a surface (light emitting surface) of a not-processed sintered body in Conventional Example.

FIG. 4 is a graph showing a roughness curve of a surface (light emitting surface) of a processed sintered body in Example 1.

DESCRIPTION OF EMBODIMENTS

Figures 1, 2A, 2B:
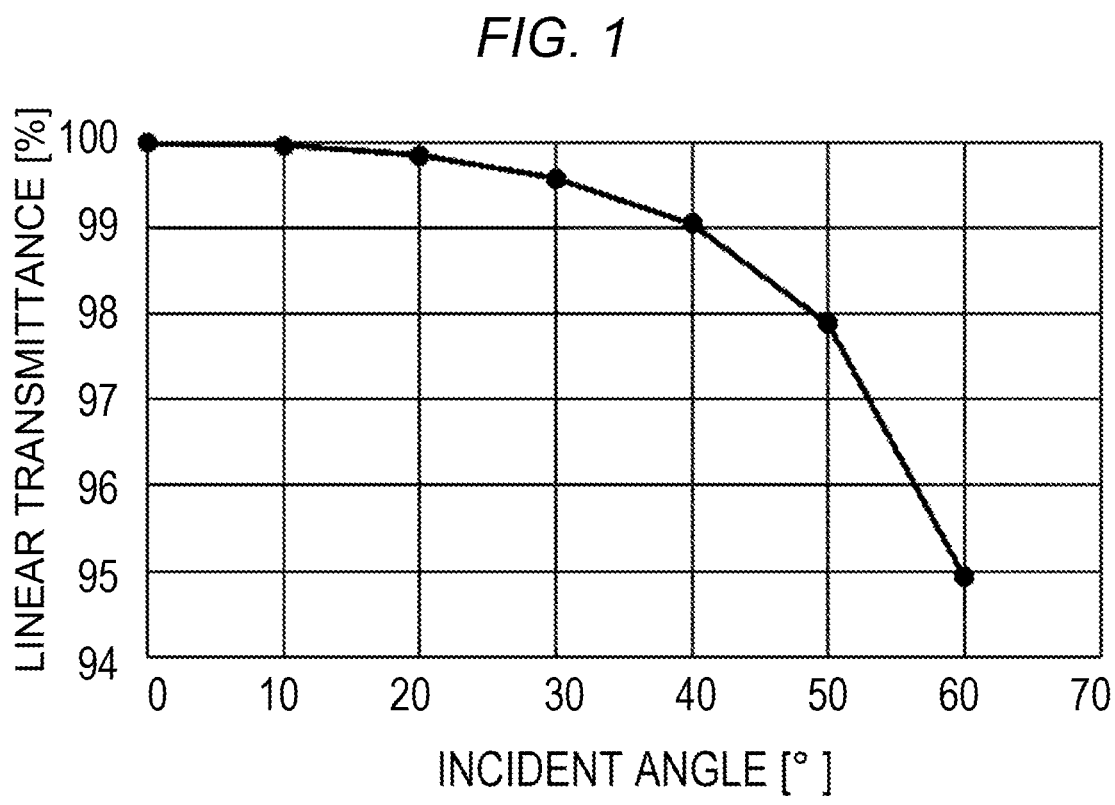
FIG. 1 is a graph showing a linear transmittance (%) with respect to an incident angle (°) of light obliquely incident, obtained by preparing a member in which an antireflection film (in which a film composed of $SiO_2$ having a thickness of 75 nm and a film composed of $Ta_2O_5$ having a thickness of 100 nm were alternately laminated for 7 layers in order to have a total thickness of 600 nm) is formed on one surface of a sapphire plate having a refractive index similar to that of a ceramic phosphor plate; and assuming that a linear transmittance when entering a light with wavelength of 550 nm which is similar to conversion wavelength of the ceramic phosphor plate to a surface of the member opposite to the antireflection film side at an incident angle of 0° is 100%.
FIG. 2A is a local cross-sectional view showing that a first surface (light emitting surface described above) on which an antireflection film is formed on a fired surface of a light wavelength conversion member in the conventional-art has a gently-sloping uneven surface up and down with a center line as a boundary.
FIG. 2B is a local cross-sectional view of a light emitting surface of a ceramic phosphor plate according to the present invention, showing a form including a convex smooth surface and a concave valley portion.

Hereinafter, a ceramic phosphor plate according to the present invention will be described in detail. The ceramic phosphor plate according to the present invention includes: a ceramic substrate having a light incident surface and a light emitting surface facing the light incident surface; and an antireflection film formed at least on the light emitting surface, in which the light emitting surface of the ceramic substrate has an uneven shape including a concave portion and a convex portion, the light emitting surface has an arithmetic mean roughness (Ra) of 0.1 $\mu$m or more and 0.7 $\mu$m or less, and a Kurtosis (Rku) obtained from a surface roughness curve of 5 or more and 10 or less.

FIG. 2B schematically shows a local cross-sectional view of the ceramic phosphor plate according to the present invention. The ceramic phosphor plate is a plate-like body made of a ceramic substrate on which an antireflection film is formed. As shown in FIG. 2B, an antireflection film side of the plate-like body is a light emitting surface, and a main surface opposite to the light emitting surface is a light incident surface.

The ceramic phosphor plate according to the present invention includes a ceramic substrate as its base. Specifically, the ceramic phosphor plate according to the present invention includes a ceramic sintered body, and preferably includes a sintered body containing an alumina (Al$_2$O$_3$) translucent body and a YAG:Ce phosphor obtained by adding Ce' to a yttrium aluminum garnet (Y$_3$Al$_5$O$_{12}$). Accordingly, the surface state (Ra, Rku) of the ceramic substrate, which will be described later, can be more appropriately controlled and formed.

The thickness of the ceramic substrate is preferably 0.05 mm or more and 1 mm or less.

The antireflection film is provided at least on the light emitting surface of the ceramic substrate.

The antireflection film may be a single layer or a multiple layers, and is usually a multilayer film including two or more kinds of materials having different refractive indexes and formed on the light emitting surface. Examples of the material for use include niobium (V) oxide (Nb$_2$O$_5$), titanium (IV) oxide (TiO$_2$), tantalum (IV) oxide (TaO$_2$), aluminum oxide (Al$_2$O$_3$), zirconium oxide (ZrO$_2$), silicon dioxide (Sift), magnesium fluoride (MgF$_2$), aluminum nitride (AlN), and silicon nitride (Si$_3$N$_4$).

The thickness of the antireflection film is preferably 500 nm or more and 700 nm or less. Accordingly, in particular, a more excellent antireflection effect can be obtained in a blue LED phosphor plate used for a white LED lamp.

The antireflection film is preferably formed not only on the light emitting surface but also on the light incident surface. Accordingly, it is possible to reduce the reflection of the blue LED light incident on the ceramic substrate.

The antireflection film is, for example, a dielectric multilayer film, and a preferable form thereof is a laminated film in which three layers or more and 10 layers or less of Sift film and Ta$_2$O$_5$ film each of which has a thickness of 10 nm or more and 100 nm or less are alternately laminated to have a total thickness of 800 nm or less. When the antireflection film is a dielectric multilayer film, a wavelength range in which an antireflection function is exhibited can be adjusted by changing the thickness of each film and the number of layers.

The light emitting surface of the ceramic substrate has an uneven shape, and the arithmetic mean roughness (Ra) thereof is 0.1 $\mu$m or more and 0.7 $\mu$m or less, and preferably 0.4 $\mu$m or more and 0.7 $\mu$m or less. The arithmetic mean roughness (Ra) is a value obtained by obtaining a roughness curve by observing from the upper surface with a confocal microscope, and averaging the area surrounded by the roughness curve and a straight line of the average value by the height when smoothed into a rectangle, in accordance with JIS B 0601: 2013.

The ceramic phosphor plate includes a ceramic substrate and an antireflection film formed on the light emitting surface of the ceramic substrate. Since the arithmetic mean roughness (Ra) and the Kurtosis (Rku) of the ceramic substrate is substantially the same as the arithmetic mean roughness (Ra) and the Kurtosis (Rku) of the ceramic phosphor plate after the antireflection film is formed thereon, the arithmetic mean roughness (Ra) and the Kurtosis (Rku) of the ceramic substrate can be measured by the above method from the upper surface of the antireflection film.

When Ra is smaller than 0.1 $\mu$m, the light extraction efficiency decreases due to specular reflection. On the other hand, when Ra is larger than 0.7 $\mu$m, the proportion of light obliquely incident on the antireflection film increases, and the extraction efficiency decreases. A graph in FIG. 1 shows that the linear transmittance of a light with wavelength of 550 nm decreases as the angle of the light obliquely incident on the antireflection film increases. In the case where the linear transmittance for the incident angle of 0° is regarded as 100%, when the incident angle is larger than 40°, the decrease in linear transmittance is remarkable, and it is about 95% at 60°.

At least on the light emitting surface of the ceramic substrate, the Kurtosis (Rku) obtained from the surface roughness curve is 5 or more and 10 or less, and preferably 6 or more and 9 or less.

The Kurtosis (Rku) is defined in JIS B 0601: 2013 and is an index indicating the degree of sharpness at the tip of an uneven portion. When the Kurtosis (Rku) is 3, the height distribution has a normal distribution, and the concave portion and the convex portion have the same shape. When the Kurtosis (Rku) is smaller than 3, both or either one of the convex portion and the concave portion has a shape which is gentle and almost flat. On the other hand, when the Kurtosis (Rku) is larger than 3, the shape of both or either one of the convex portion and the concave portion is sharp.

The ceramic substrate according to the present invention, as shown in FIG. 2B, has a light emission surface consisting of an upper surface of a convex portion obtained by grinding the fired surface of the ceramic substrate substantially parallel to the light incident surface and a sharp concave portion where the fired surface remains as it is, and the light emitting surface has a Kurtosis Rku of 5 or more. In the form shown in FIG. 2B, a distance between the concave bottom and the convex top is not as long as the light wavelength conversion member shown in FIG. 2A, but as indicated by the arrows in the figure, blue light is reflected multiple times and propagates over a relatively long distance, so that the light conversion efficiency can be improved. In addition, in the form shown in FIG. 2B, since the upper surface of the convex portion is a flat surface, diffuse reflection does not occur and the extraction efficiency does not decrease.

The ceramic substrate may have an uneven shape including a flat convex top and a sharp concave portion as shown in FIG. 2B, or may have a fine sword-like structure in which convex portions on the light emitting surface are spaced by several μm. However, in order to obtain an uneven shape having a Kurtosis Rku of 5 or more, it is usual to grind the convex portion, among the uneven shape of the fired surface, by a specific height, and the uneven shape shown in FIG. 2B is preferred since it is easier to handle when the surface is a flat convex shape rather than a sword-like surface.

However, when the Kurtosis (Rku) is more than 10, a large number of concave portions are present and the Kurtosis of the concave portion increases, so that diffuse reflection increases and the extraction efficiency decreases.

In the ceramic substrate according to the present invention, the upper surface of the convex portion of the light emitting surface is a surface obtained by grinding or polishing the fired surface of the ceramic substrate substantially parallel to the light incident surface, whereby more sufficient light extraction efficiency can be achieved. In addition, the concave portion of the light emitting surface is the fired surface of the ceramic substrate, whereby light obliquely incident on the concave portion (in other words, a side surface of the convex portion having a flat upper surface) is easily scattered, and multiple reflections can be generated to further improve the conversion efficiency.

For a method of producing the ceramic phosphor plate, a case where a sintered body made of a YAG:Ce phosphor and an alumina translucent body is used will be described as an example.

Yttrium (III) oxide ($Y_2O_3$), cerium (IV) oxide ($CeO_2$), gadolinium (III) oxide ($Gd_2O_3$), and aluminum oxide ($Al_2O_3$) are blended, formed into a sheet shape, then degreased, and punched by press working to prepare a green formed product having a predetermined shape. Next, the green formed product is fired in a vacuum atmosphere of $1.0 \times 10^{-2}$ Pa or less in a medium vacuum to low vacuum to obtain a ceramic substrate. The ceramic substrate is a sintered body made of a YAG:Ce phosphor and an alumina translucent body.

In the sintered body, the concentration of YAG particles is preferably 20 vol % or more and 30 vol % or less with respect to the total amount (100 vol %) of the YAG particles and $Al_2O_3$ particles. The concentration of the $Al_2O_3$ particles is preferably 70 vol % or more and 80 vol % or less with respect to the total amount (100 vol %) of the YAG particles and the $Al_2O_3$ particles. The average particle diameter of the YAG particles is usually 4 μm or more and 6 μm or less, and the ratio of the average particle diameter of the $Al_2O_3$ particles to the average particle diameter of the YAG particles ($Al_2O_3$ average particle diameter/YAG average particle diameter) is preferably 1 or more and 2 or less. Accordingly, a ceramic substrate with improved light emission efficiency can be obtained.

A large amount of abrasive particles are sprayed onto the surface of the ceramic substrate using, for example, an abrasive particle injection polishing device using compressed air or the like as a medium, whereby the uneven shape including a concave portion and a convex portion is processed. Specifically, using compressed air of 0.4 MPa to 0.6 MPa, abrasive particles such as artificial diamond having an average particle diameter of 30 μm to 70 μm are sprayed onto the surface of the ceramic substrate for a predetermined time (for example, about 10 minutes), whereby the Kurtosis (Rku) of the light emitting surface of the ceramic substrate can be set to 5 or more and 10 or less. The grinding processing by injecting the abrasive particles may be performed only on the side to be the light emitting surface, or may be applied not only to the light emitting surface but also to the side to be the light incident surface.

The method for processing the uneven shape is not limited to the above method, and for example, grinding with a grindstone surface plate may be used, and after grinding, etching processing or lap polishing may be performed.

Next, an antireflection film is formed on the ceramic substrate subjected to surface processing. When the above dielectric multilayer film is formed as the antireflection film, the $SiO_2$ film and the $Ta_2O_5$ film are alternately laminated by using a film forming method such as a vacuum vapor deposition method or a sputtering method.

EXAMPLES

Hereinafter, the present invention will be specifically described based on Examples, but the present invention is not limited to the Examples shown below.

Example 1

A cerium (IV) oxide powder (average particle diameter: 0.7 μm), an yttrium (III) oxide powder (average particle diameter: 0.6 μm), and an aluminum oxide powder (average particle diameter: 1 μm) were mixed at a predetermined blending ratio to obtain a raw material powder. Alcohol as a dispersion medium, polyvinyl butyral as a binder, and dibutyl succinate as a plasticizer were added to the raw material powder, and the mixture was pulverized and mixed with a ball mill to prepare a slurry.

Using this slurry, a green sheet having a predetermined thickness is formed by a doctor blade method, degreased and fired in the atmosphere, to obtain a $Al_2O_3 + Y_3Al_5O_{12}$:Ce sintered body.

The one surface of the $Al_2O_3 + Y_3Al_5O_{12}$:Ce sintered body was processed to have an uneven shape by injecting an elastic abrasive having an abrasive particle diameter of 1 μm or less for about 10 minutes using a mirror shot machine (product name SMAP, manufactured by TOYO KEN-MAZAI KOGYO K.K.). That is, a ceramic substrate was prepared in which the upper surface of the convex portion of the light emitting surface was a surface obtained by grinding or polishing a fired surface of the ceramic substrate substantially parallel to the light incident surface, and the concave portion of the light emitting surface was the fired surface of the ceramic substrate.

Figures 3, 4:
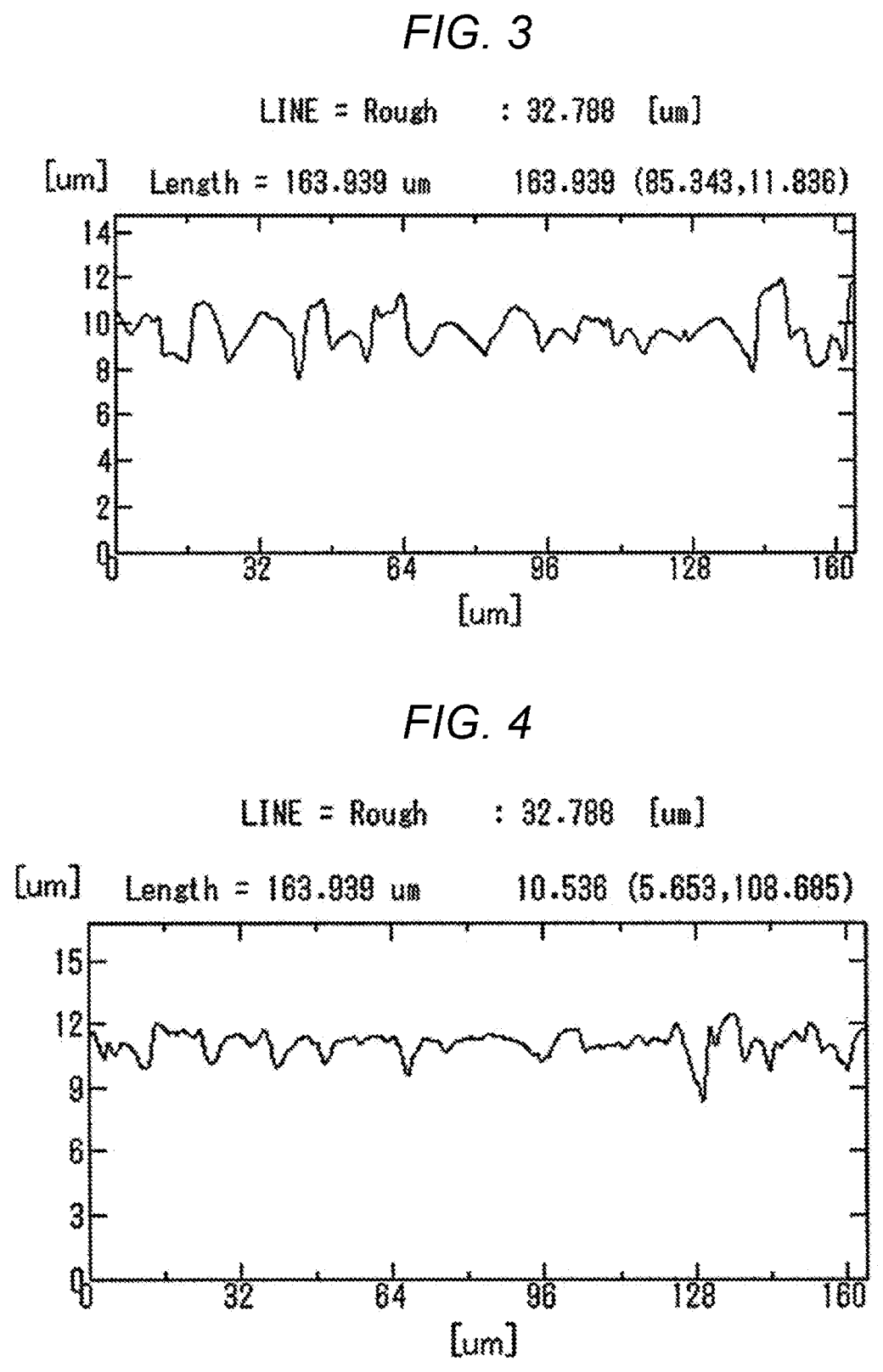

The arithmetic mean roughness (Ra) and the Kurtosis (Rku) of the light emitting surface of the $Al_2O_3 + Y_3Al_5O_{12}$:Ce sintered body after processing were measured using a laser microscope HD-100D manufactured by Lasertec Corporation with a measurement length of 0.032 mm and a cutoff value of 0.8 mm, and as a result, Ra was 0.47 μm and Rku was 6.5. That is, the Kurtosis (Rku) was obtained from the surface roughness curve on the light emitting surface of the $Al_2O_3 + Y_3Al_5O_{12}$:Ce sintered body, in accordance with JIS B 0601: 2013. FIG. 4 is a graph in which the reference length is plotted on the horizontal axis and the height from the average plane is plotted on the vertical axis, and indicates a surface roughness curve.

Next, a film composed of $SiO_2$ having a thickness of 75 nm and a film composed of $Ta_2O_5$ having a thickness of 100 nm were laminated for 7 layers in order on the $Al_2O_3+Y_3Al_5O_{12}$:Ce sintered body after processing, and an antireflection film having a thickness of 600 µm was formed, to obtain a ceramic phosphor plate. After forming the antireflection film, the arithmetic mean roughness (Ra) and the Kurtosis (Rku) of the light emitting surface of the ceramic phosphor plate were measured in the same manner, and the results thereof were same as measured value for the light emitting surface of $Al_2O_3+Y_3Al_5O_{12}$:Ce sintered body.

Using a spectrophotometer (UH4150, manufactured by Hitachi High-Tech Science Corporation) using an integrating sphere, the total transmittance in the entire visible light range, namely transmittance at an incident angle of 0°, was measured without setting the ceramic phosphor plate. Thereafter, the ceramic phosphor plate prepared in Example 1 was set, and the total transmittance in the entire visible light range was measured. The ratio of the latter transmittance to the former transmittance at a wavelength of 550 nm was measured and calculated as the light extraction efficiency.

The light extraction efficiency by the measuring method was 65%.

Example 2

A ceramic phosphor plate was prepared in the same manner as in Example 1, except that surface processing using a mirror shot machine (product name SMAP, manufactured by TOYO KENMAZAI KOGYO K.K.) was performed by injecting an elastic abrasive having an abrasive particle diameter of 1 µm or less for about 20 minutes.

The arithmetic mean roughness (Ra) and the Kurtosis (Rku) of the light emitting surface of the ceramic phosphor plate were measured similar to Example 1, and as a result, Ra was 0.10 µm and Rku was 6.7.

In addition, the light extraction efficiency of the ceramic phosphor plate was measured similar to Example 1, and was 63%.

Example 3

A ceramic phosphor plate was prepared in the same manner as in Example 1, except that surface processing using a mirror shot machine (product name SMAP, manufactured by TOYO KENMAZAI KOGYO K.K.) was performed by injecting an elastic abrasive having an abrasive particle diameter of 1 µm or less for about 5 minutes.

The arithmetic mean roughness (Ra) and the Kurtosis (Rku) of the light emitting surface of the ceramic phosphor plate were measured similar to Example 1, and as a result, Ra was 0.70 µm and Rku was 6.5.

In addition, the light extraction efficiency of the ceramic phosphor plate was measured similar to Example 1, and was 61%.

Example 4

A ceramic phosphor plate was prepared in the same manner as in Example 1, except that the average particle diameter of the yttrium (III) oxide powder was 0.4 µm, and the average particle diameter of the aluminum oxide powder was 0.1 µm.

The arithmetic mean roughness (Ra) and the Kurtosis (Rku) of the light emitting surface of the ceramic phosphor plate were measured similar to Example 1, and as a result, Ra was 0.45 µm and Rku was 5.0.

In addition, the light extraction efficiency of the ceramic phosphor plate was measured similar to Example 1, and was 61%.

Example 5

A ceramic phosphor plate was prepared in the same manner as in Example 1, except that the average particle diameter of the yttrium (III) oxide powder was 0.8 µm, and the average particle diameter of the aluminum oxide powder was 2.0 µm.

The arithmetic mean roughness (Ra) and the Kurtosis (Rku) of the light emitting surface of the ceramic phosphor plate were measured similar to Example 1, and as a result, Ra was 0.49 µm and Rku was 10.0.

In addition, the light extraction efficiency of the ceramic phosphor plate was measured similar to Example 1, and was 63%.

Conventional Example

An antireflection film was formed in the same manner as in Example 1 using a $Al_2O_3+Y_3Al_5O_{12}$:Ce sintered body same as in Example 1 without performing surface processing.

The arithmetic mean roughness (Ra) and the Kurtosis (Rku) of the light emitting surface of the ceramic phosphor plate were measured similar to Example 1, and as a result, Ra was 0.56 µm and Rku was 2.9. FIG. 3 is a graph in which the reference length is plotted on the horizontal axis and the height from the average plane is plotted on the vertical axis, and indicates a surface roughness curve.

In addition, the light extraction efficiency of the ceramic phosphor plate was measured similar to Example 1, and was 59%.

Comparative Example 1

A ceramic phosphor plate was prepared in the same manner as in Example 1, except that surface grinding was performed for about 10 minutes with a whetstone of number of 600-800, and surface processing using a mirror shot machine (product name SMAP, manufactured by TOYO KENMAZAI KOGYO K.K.) was performed by injecting an elastic abrasive having an abrasive particle diameter of 1 µm or less for about 10 minutes.

The arithmetic mean roughness (Ra) and the Kurtosis (Rku) of the light emitting surface of the sintered body after processing were measured similar to Example 1, and as a result, Ra was 0.05 µm and Rku was 6.4.

In addition, the light extraction efficiency of the ceramic phosphor plate was measured similar to Example 1, and was 58%.

Comparative Example 2

A ceramic phosphor plate was prepared in the same manner as in Example 1, except that surface grinding was performed for about 10 minutes with a whetstone of number of 320-400, and surface processing using a mirror shot machine (product name SMAP, manufactured by TOYO KENMAZAI KOGYO K.K.) was performed by injecting an elastic abrasive having an abrasive particle diameter of 1 μm or less for about 10 minutes.

The arithmetic mean roughness (Ra) and the Kurtosis (Rku) of the light emitting surface of the ceramic phosphor plate were measured similar to Example 1, and as a result, Ra was 0.90 μm and Rku was 6.6.

In addition, the light extraction efficiency of the ceramic phosphor plate was measured similar to Example 1, and was 50%.

Comparative Example 3

A ceramic phosphor plate was prepared in the same manner as in Example 1, except that the average particle diameter of the yttrium (III) oxide powder was 0.3 μm, and the average particle diameter of the aluminum oxide powder was 0.1 μm.

The arithmetic mean roughness (Ra) and the Kurtosis (Rku) of the light emitting surface of the ceramic phosphor plate were measured similar to Example 1, and as a result, Ra was 0.44 μm and Rku was 3.2.

In addition, the light extraction efficiency of the ceramic phosphor plate was measured similar to Example 1, and the light extraction efficiency was 52%.

Comparative Example 4

A ceramic phosphor plate was prepared in the same manner as in Example 1, except that the average particle diameter of the yttrium (III) oxide powder was 1.0 μm, and the average particle diameter of the aluminum oxide powder was 2.5 μm.

The arithmetic mean roughness (Ra) and the Kurtosis (Rku) of the light emitting surface of the ceramic phosphor plate were measured similar to Example 1, and as a result, Ra was 0.50 μm and Rku was 11.9.

In addition, the light extraction efficiency of the ceramic phosphor plate was measured similar to Example 1, and the light extraction efficiency was 58%.

The results for Examples 1 to 5 and Comparative Examples 1 to 4 are shown in Table 1.

TABLE 1

| | Ra (μm) | Rku | Light extraction efficiency (%) |
|---|---|---|---|
| Comparative Ex. 1 | 0.05 | 6.4 | 58% |
| Example 2 | 0.10 | 6.7 | 63% |
| Example 1 | 0.47 | 6.5 | 65% |
| Example 3 | 0.70 | 6.5 | 61% |
| Comparative Ex. 2 | 0.90 | 6.6 | 50% |
| Comparative Ex. 3 | 0.44 | 3.2 | 52% |

TABLE 1-continued

| | Ra (μm) | Rku | Light extraction efficiency (%) |
|---|---|---|---|
| Example 4 | 0.45 | 5.0 | 61% |
| Example 5 | 0.49 | 10.0 | 63% |
| Comparative Ex. 4 | 0.50 | 11.9 | 58% |

As seen from the above, it was confirmed that, in a ceramic phosphor plate including a ceramic substrate having a light incident surface and a light emitting surface facing the light incident surface, and an antireflection film formed on the light emitting surface, the light emitting surface of the ceramic substrate has an uneven shape including a concave portion and a convex portion, the arithmetic mean roughness (Ra) of the light emitting surface is 0.1 μm or more and 0.7 μm or less, and the Kurtosis (Rku) obtained from a surface roughness curve is 5 or more and 10 or less, whereby the light extraction efficiency is improved.

Although the present invention has been described above in detail and with reference to its specific embodiment, it is obvious for those in the art that various modifications or changes can be made without departing from the spirit and scope of the present invention.

The present application is based on Japanese Patent Application No. 2021-213732, filed on Dec. 28, 2021, and Japanese Patent Application No. 2022-106091, filed on Jun. 30, 2022, the contents of which are incorporated herein by reference.

What is claimed is:

1. A ceramic phosphor plate comprising:

a ceramic substrate having a light incident surface and a light emitting surface facing the light incident surface; and an antireflection film formed at least on the light emitting surface, wherein the light emitting surface of the ceramic substrate has an uneven shape including a concave portion and a convex portion, wherein the light emitting surface has an arithmetic mean roughness (Ra) of 0.1 μm or more and 0.7 μm or less, and a Kurtosis (Rku) obtained from a surface roughness curve of 5 or more and 10 or less, wherein an upper surface of the convex portion of the light emitting surface is a surface obtained by grinding or polishing a fired surface of the ceramic substrate substantially parallel to the light incident surface, and wherein the concave portion of the light emitting surface is the fired surface of the ceramic substrate.

2. The ceramic phosphor plate according to claim 1, wherein the antireflection film comprises two or more kinds of materials having different refractive indexes, and has a total thickness of 500 nm or more and 700 nm or less.

* * * * *